United States Patent [19]

Heile

[11] 4,027,237

[45] May 31, 1977

[54] AIRBORNE MICROWAVE REFRACTOMETER

[75] Inventor: William A. Heile, Indianapolis, Ind.

[73] Assignee: The United States of America as represented by the Secretary of the Navy, Washington, D.C.

[22] Filed: July 22, 1976

[21] Appl. No.: 707,904

[52] U.S. Cl. .................................. 324/58.5 C
[51] Int. Cl.² ................................ G01R 27/04
[58] Field of Search .............. 324/58.5 C, 58.5 A

[56] References Cited

UNITED STATES PATENTS

| | | | |
|---|---|---|---|
| 2,637,767 | 5/1953 | Hershberger | 324/58.5 A |
| 3,356,941 | 12/1967 | Everman | 324/58.5 C |
| 3,482,161 | 12/1969 | Poulter | 324/58.5 A |
| 3,601,695 | 8/1971 | Heile | 324/58.5 C |

Primary Examiner—Stanley T. Krawczewicz
Attorney, Agent, or Firm—R. S. Sciascia; Paul S. Collignon

[57] ABSTRACT

An airborne absolute microwave refractometer for obtaining an instantaneous and continuous index of refraction of the atmosphere through which an aircraft bearing the refractometer is flying. A sampling cavity is mounted on an aircraft and is open to the outside atmosphere. A harmonic of a low frequency sweep oscillator is phase locked to the microwave sampling cavity and measurement of the average oscillator frequency by a binary counter arrangement provides a direct measurement of refractivity.

9 Claims, 4 Drawing Figures

AIRBORNE MICROWAVE REFRACTOMETER

BACKGROUND OF THE INVENTION

The present invention relates to refractometers and more particularly to airborne types of microwave refractometers to obtain an instantaneous and continuous index of refraction of the atmosphere through which the aircraft bearing the refractometer is flying to evaluate the microwave energy scattering occasioned by these changes. Changes in the index of refraction of the atmosphere can be compensated in such equipment as radio and radar transmitters and receivers, and the like.

In the 1950s the method of measuring refractive index profiles of the atmosphere employed complex vacuum tube devices requiring highly skilled operators but these devices were not suitable for general usage. In the early 1960s refractometer devices were developed with solid state elements therein. One such solid-state refractometer was developed and disclosed in U.S. Pat. No. 3,356,941 which exceeded the capabilities of the tube devices but had the disadvantage of requiring a long warm-up period prior to use and also required good temperature control to obtain satisfactory results.

In U.S. Pat. No. 3,601,695, which issued Aug. 24, 1971, to the present inventor, there is described a refractometer which did not require any warm-up time. In this device the oscillations of a temperature compensated crystal controlled oscillator and a sweep oscillator are mixed and the difference frequency filtered into two intermediate frequency (IF) channels. One channel provides an automatic frequency control (AFC) for the sweep oscillator while the other channel provides automatic bandwidth control (ABC) for the sweep oscillator thereby eliminating the necessity for oven controlled circuit temperature. This precisely controlled sweep frequency is applied to a transmission type sampling cavity exposed to the atmosphere. When a resonant frequency is encountered, an electrical signal is developed and converted to a DC signal representative of the refractive index of the atmosphere. The disadvantage of this patented device is that the use of two microwave frequency sources are required which add considerably to the size, cost and power consumption of the refractometer.

SUMMARY OF THE INVENTION

A cavity unit is mounted external to an aircraft and has a sampling cavity which is open to the outside atmosphere. The dimensions of the mechanically tunable cavity are such that it resonates at a frequency of 9,408 MHz in a vacuum. A harmonic of a low frequency sweep oscillator is phase locked to the microwave sampling cavity by a sweep lock circuit. A portion of the output of the RF sweep oscillator is fed through a gate to a presettable counter. The precise gate time for the counter is generated by a gate time generator so that a unit change in the index of refraction of air within the sampling cavity will cause a known difference of counts in the presettable counter. The digital information in the counter is then strobed into a latch which holds the count stable for a digital to analog converter which provides a DC output voltage proportional to the average index of refraction of the air within the sampling cavity during the gate interval.

It is therefore a general object of the present invention to provide a microwave refractometer for providing instantaneous and continuous index of refraction of the atmosphere through which an aircraft bearing the refractometer is flying to evaluate the microwave energy scattering occasioned by changes of refraction of the atmosphere.

Other objects, advantages and novel features of the present invention will become apparent from the following detailed description when considered in conjunction with the accompanying drawings.

DESCRIPTION OF THE PREFERRED EMBODIMENT

Figure 1:
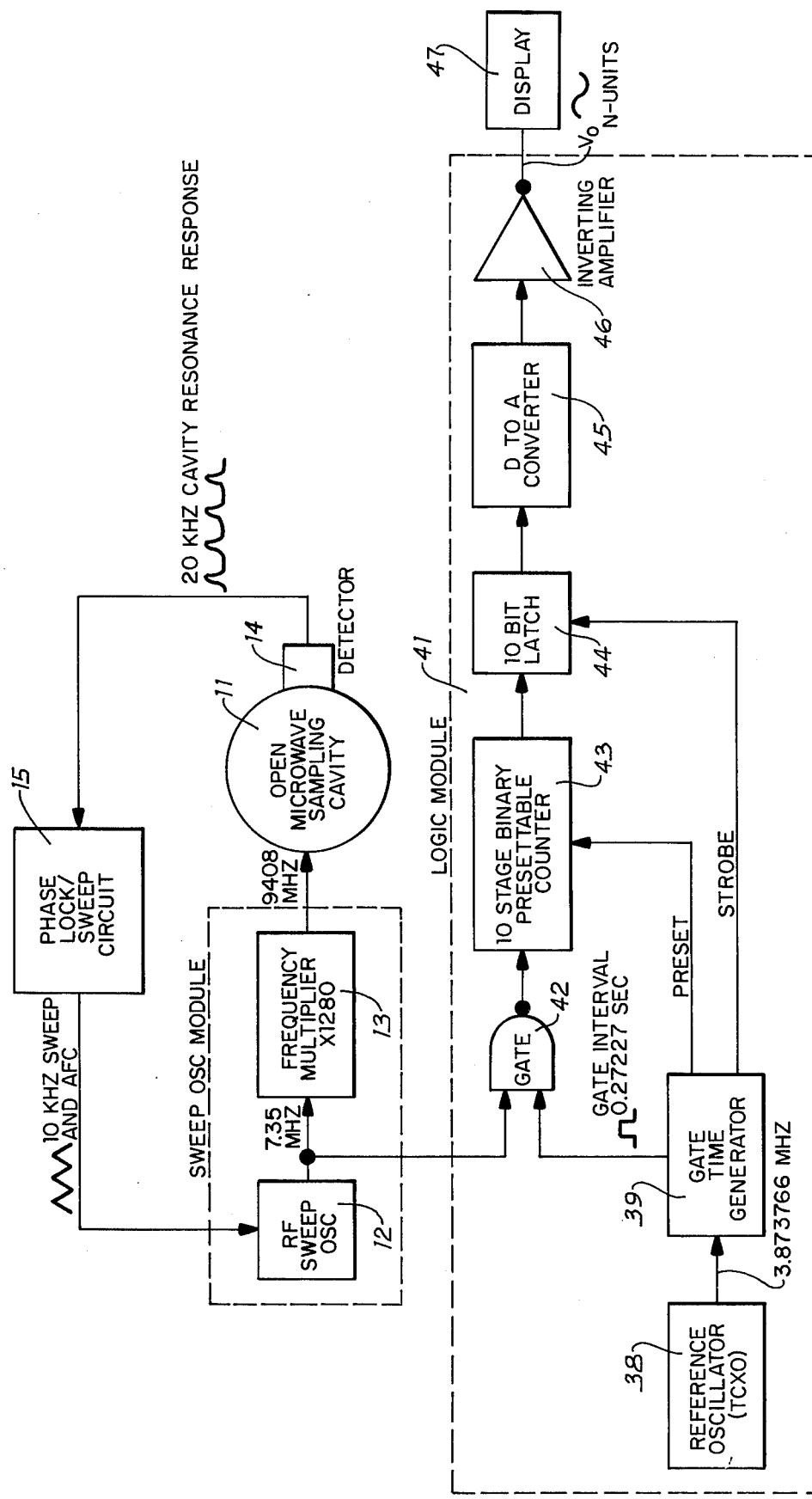
FIG. 1 is a block diagram of a preferred embodiment of the present invention.

Refraction is defined as a bending or change of direction of a ray, as of light or heat, in passage from one medium to another of different density. The refractive index (n) of a medium (such as air) is defined by equation (1) as the ratio of the velocity of propagation in a vacuum (c) to the velocity (v) in the medium.

$$n = c/v \quad (1)$$

For air near the surface of the earth (sea level), the radio refractive index varies between approximately 1.000250 and 1.000450. For simplicity, a quantity called the refractivity (N) in N-Units is defined by equation (2):

$$N = (n-1) \times 10^6 \quad (2)$$

The refractivity of surface air, therefore, varies between approximately 250 and 450 N-units. Refractivity tends to decrease exponentially with altitude. At 20,000 feet, the expected N-value is 145 ± 10 N-units.

Atmospheric refractivity is frequency dependent when the entire electromagnetic spectrum is considered. However, for radio frequencies up to at least 70 Gigahertz (70 × 10⁹ cycles per second), this property (called dispersion) is negligible. Atmospheric refractivity at optical frequencies is considerably lower than for radio frequencies since light rays are less affected by moisture. Visual and radar ranges are therefore affected differently by atmospheric bending so that what can be seen by the eye may not always be seen by radar and vice versa.

Bending of radio and radar rays by the atmosphere is determined by the changes or gradients in refractivity along a ray path and by the angle of penetration of the rays. The atmosphere is generally assumed to be horizontally homogeneous and only vertical refractivity changes are considered. Refractive bending effects are most pronounced at small angles to the horizontal on the order of 1° or less. Aircraft radars and radios operating within or above atmospheric layers having a strong decrease of refractivity with height are susceptible to "holes" or blind spots in their coverage. This effect is caused by a concentration of energy within the refractive layer resulting in a reduction of energy above the layer. In general, the higher the radar is above the layer, the further out in range these effects occur.

The refractivity of air can be measured directly with a refractometer or can be computed from measurements of temperature (T), pressure (P) and relative humidity (R.H.) according to equation (3):

$$N = 77.6(P/T) + 3.73 \times 10^5 (e_S \times R.H.)/T^2$$

where
N is the computed refractivity in N-units.
P is the measured ambient (static) pressure in millibars.
T is the measured temperature in degrees K (°C + 273).
$e_S$ is the vapor pressure of saturated air in millibars at the measured temperature.
R.H. is the measured relative humidity expressed as a decimal fraction (i.e., 50% = 0.50).

Equation (3) is considered accurate to 0.5% in N. Considerably larger errors result from uncertainty in the measurements of pressure, temperature and, especially, relative humidity. At normal room conditions, a 1 N-unit error would result from a 4 mb pressure error, a 1°F(0.6° C) temperature error or a 1% relative humidity error.

Referring now to FIG. 1 of the drawings, there is shown a sampling cavity 11 which is designed to be mounted on an aircraft and which is open to the outside atmosphere. The dimensions of the mechanically tunable cavity are such that it resonates at a frequency of 9,408 MHz in a vacuum which corresponds to a refractivity of 0 N-units, by definition. In air, the resonant frequency of the cavity decreases by approximately 9.4 kHz per N-unit owing to the higher dielectric constant. For air of 300 N-units, the resonant frequency is 9,405.18 MHz.

A harmonic of a low frequency sweep oscillator is phase locked to the microwave sampling cavity 11, and, as hereinafter described, the measurement of the average oscillator frequency is a direct measurement of refractivity. An RF sweep oscillator 12 and a 1280 times frequency multiplier 13 together comprise the sweep oscillator module. In this module, the 7.35 MHz source frequency is doubled five times with conventional transistor frequency multipliers to a frequency of 235.2 MHz. At this frequency, the signal is amplified to a power level of 0.4 ± 0.1 watt. This signal is fed to a step recovery (varactor) diode which is mounted inside a two stage coaxial cavity bandpass filter. The step recovery diode generates a wide harmonic spectrum. The coaxial filter is tuned to the 40th harmonic which is the desired output frequency of 9,408 MHz. The power output at the selected harmonic is approximately 1 milliwatt. Adjacent harmonics and spurious responses are at least 20 dB down. The refractometer will "lock" onto the sampling cavity with up to 20 dB of external cable loss.

A detector 14 is connected with the sampling cavity 11 and detects amplitude of the power transmitted through cavity 11. This power is a maximum at the resonance frequency of cavity 11. The detected cavity response is fed into a phase lock/sweep circuit 15, which is shown in greater detail in FIG. 2 of the drawings.

Figure 2:
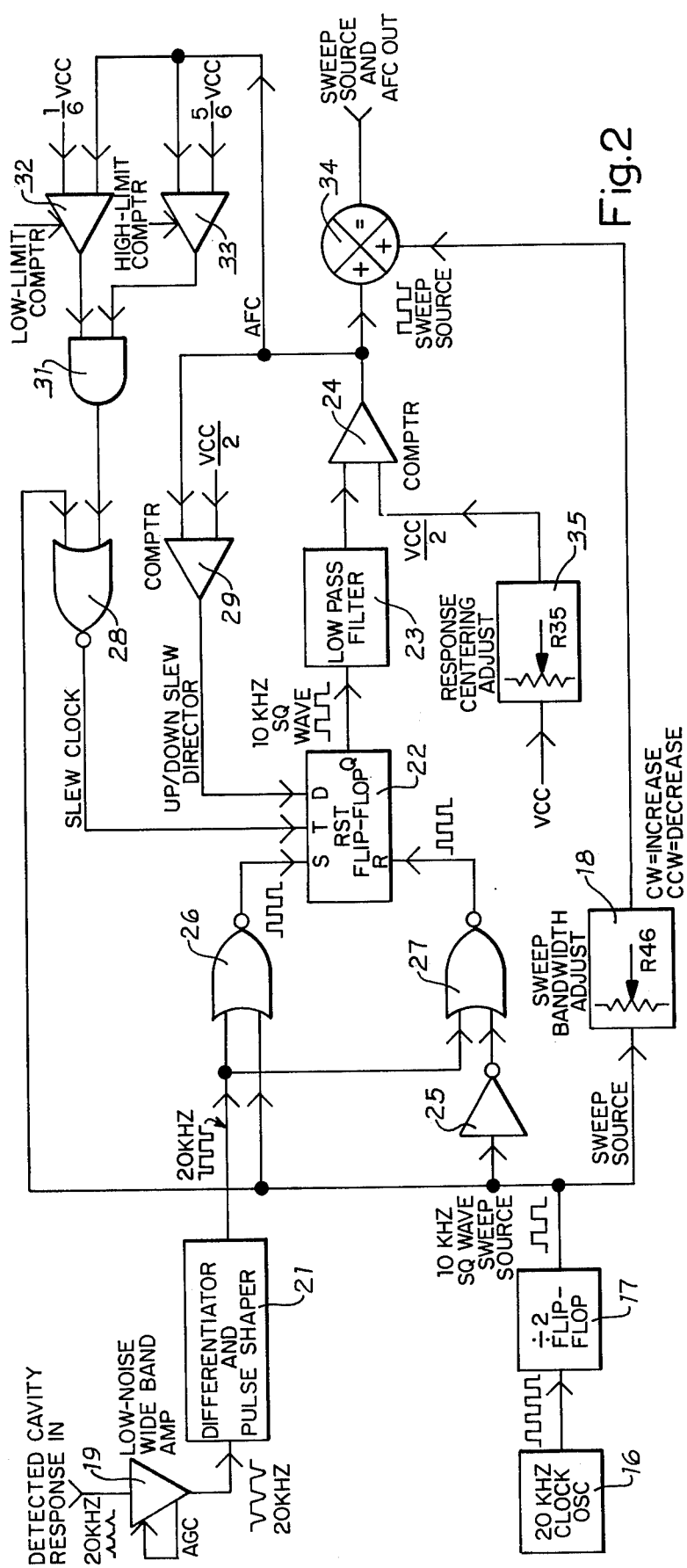
FIG. 2 is a block diagram of the lock module shown in FIG. 1 of the drawings.
Figure 4:
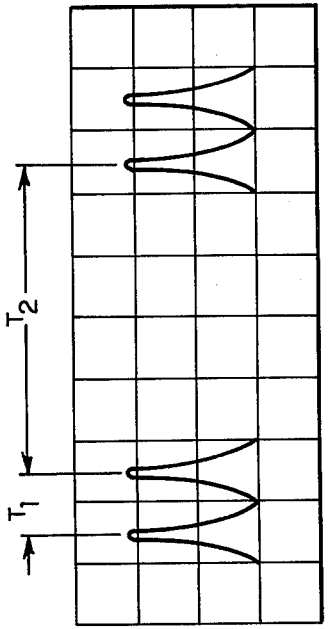
FIG. 4 is a diagram showing a waveform having a nonsymmetrical resonance response.
Figure 3:
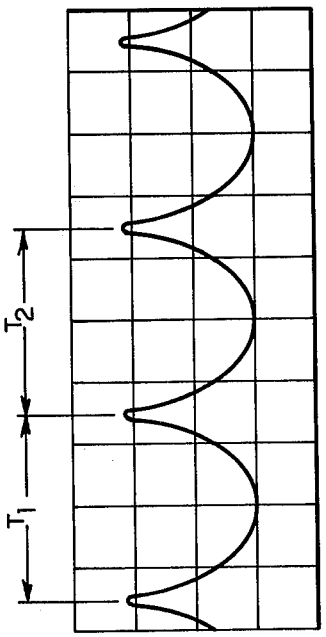
FIG. 3 is a diagram showing a waveform having a periodic symmetrical resonance response.

Referring now to FIG. 2 of the drawings, the phase lock/sweep circuit 15 contains the sweep source for the sweep oscillator which originates from a 20 kHz (approximate) clock 16. This signal is routed to a divide-by-two flip-flop 17 to insure a symmetrical duty cycle. This 10 kHz signal is attenuated by the sweep bandwidth adjustment potentiometer 18. The attenuated square wave is combined with a DC error voltage known as the automatic frequency control (AFC). The combined AFC and sweep signals are then routed to the sweep oscillator module to control the frequency and sweep bandwidth of the sweep oscillator 12. The square wave sweep signal is first converted to a triangular signal which then frequency modulates the sweep oscillator. If the average or center frequency out of the sweep oscillator frequency multiplier is exactly the same as the resonant frequency of the sampling cavity, the cavity detector will produce a periodic symmetrical 20 kHz resonance response as shown in FIG. 3. Otherwise, the repetitive cavity response (if present) will be nonsymmetrical occurring in pairs as shown in FIG. 4 of the drawings. The remaining electronics of the phase lock/sweep circuit 15 consists of a cavity response amplifier and a phase detector. The amplified cavity response is differentiated and a narrow pulse is generated corresponding to the peak of the resonance response. These pulses are alternately steered to the set and reset inputs of a flip-flop 22. The output of the flip-flop will be exactly symmetrical (50% duty cycle) only if the cavity resonance response is equally spaced in phase. This square wave is filtered by a low pass filter 23 and the average DC value is compared by comparator 24 in magnitude to one-half of the +15 V supply. The comparator output is the AFC voltage which can swing from ground to almost +15 V. The comparison is phased as negative feedback so that the AFC voltage will cause the sweep oscillator 12 to track or "lock" onto the cavity resonance frequency. At turn-on, or whenever no cavity response is detected, the AFC slew circuit will cause the AFC to ramp up and down between +3 volts and +12 volts until "lock" is automatically restored. When rain gets inside the sampling cavity 11, the resonance response signal is greatly attenuated. If the resonance signal decreases below 10 millivolts peak-to-peak, "lock" is lost. Lock is automatically restored after the rain evaporates or freezes. This usually requires about 4 minutes after the aircraft exits the rainy area. Refraction caused radio and radar problems are generally a fair weather phenomenon. Rainfall mixes the atmosphere vertically which tends to eliminate strong refractivity variations.

Referring again to FIG. 1 of the drawings, logic module 41 performs the function of a frequency counter. The 7.35 MHz low frequency output of the sweep oscillator 12 is averaged for 0.27227 second by the counter gate 42 time. This results in a terminal count sensitivity of two counts per N-unit. The time between counting intervals required to strobe and preset the counters is only 2.6 milliseconds. The refractivity count is therefore updated between three and four times per second. The binary output of counter 43 is converted to a 0 to 10 VDC analog voltage by the digital to analog converter 45. The final output is inverted by a DC amplifier 46 to provide an increasing output voltage for increasing N-unit. The output sensitivity is 0.02 volt/N-unit. In normal operation with cavity "lock" the ten stage binary presettable counter 43 actually overflows 1,954 times during the 0.27227 second count interval. If an overflow count other than 1,954 is detected, other circuitry (not shown) can be provided to indicate a "no-lock" condition exists. A no-lock indication can also occur if the sampling cavity 11 is detuned sufficiently to result in readings outside the 0 to 500 N-unit range of the refractometer.

The output voltage $V_o$ from amplifier 46 is applied to one or more types of display units 47. By way of example, a digital display might be used to provide a visual display of N-units to a pilot or observer and also a strip chart or a magnetic recorder might be employed to provide a permanent record for analysis at a later time.

OPERATION

The sampling cavity 11 is mounted external to an aircraft and, as the aircraft flies through the atmosphere, a measure of refractivity is made and displayed. Cavity 11 is connected with a microwave source consisting of RF sweep oscillator 12 and frequency multiplier 13. The microwave source is locked in frequency to the resonant frequency of cavity 11 by the phase lock/sweep circuit 15. If the average or center frequency out of the sweep oscillator frequency multiplier 13 is exactly the same as the resonant frequency of sampling cavity 11, cavity detector 14 will produce a periodic symmetrical 20 kHz resonance response as shown in FIG. 3 of the drawings. When the average or center frequency out of frequency multiplier 13 is different from the resonant frequency of sampling cavity 11, the repetitive cavity response will be nonsymmetrical occurring in pairs as shown in FIG. 4 of the drawings. It is the function of phase lock/sweep circuit to cause the sweep oscillator 12 to track or "lock" onto the cavity resonance frequency.

The amplified cavity response is differentiated and a narrow pulse is generated corresponding to the peak of the resonance response. These pulses are alternately steered through gates 26 and 27 to the set and reset inputs of flip-flop 22. The output of flip-flop 22 will be exactly symmetrical only if the cavity resonance response is equally spaced in phase. The square wave output from flip-flop 22 is filtered and the average DC value is compared in magnitude to one-half of the +15 V supply (Vcc). The comparison is phased as negative feedback so that the AFC voltage will cause sweep oscillator 12 to track or "lock" onto the cavity resonance frequency. When the unit is first turned-on, or when no cavity response is detected, the AFC slew circuit will cause the AFC to ramp up and down between +3 volts and +12 volts until "lock" is automatically restored.

A portion of the output of RF sweep oscillator 12 is fed through gate 42 to a presettable counter 43. The precise gate time for counter 43 is generated by reference oscillator 38 and gate time generator 39 so that a change in the index of refraction within sampling cavity 11 of 500 N-units will cause a difference of 1000 counts in counter 43. Counter 43 overflows 1954 times during the gate time which is very long compared to the sweep period of RF sweep oscillator 12.

The terminal count of counter 43 is strobed into latch 44 which holds the count stable for a digital to analog converter 45 which provides a DC output voltage proportional to the average index of refraction of the air within the sampling cavity during the gate interval. The final output is inverted by DC amplifier 46 to provide an increasing output voltage for increasing N-units, and the inverted output is applied to one or more display units 47.

It can thus be seen that the present invention provides an improved microwave refractometer which can obtain an instantaneous and continuous index of refraction of the atmosphere through which an aircraft bearing the refractometer is flying.

Obviously many modifications and variations of the present invention are possible in the light of the above teachings. It is therefore to be understood that the invention may be practiced otherwise than as specifically described.

I claim:

1. An airborne microwave refractometer for determining the refractive index of air and providing an output of refractivity in N-units comprising,
   an open sampling cavity having an input and an output,
   sweep oscillator means for generating radio frequencies over a range of frequencies coupled to said input of said open sampling cavity to acquire resonance when a specific frequency in said range of frequencies resonate with said cavity to produce a resonate signal at said output,
   a detector coupled to said output of said sampling cavity for detecting said resonate signal,
   feedback circuit means connected between said detector and said sweep oscillator for equalizing the center frequency of said sweep oscillator and the resonant frequency of said sampling cavity,
   counter means having an input and an output for counting the frequency output of said sweep oscillator,
   gating means connected between said sweep oscillator means and said input of said counter means for loading the output frequency of said sweep oscillator means into said counter means for a predetermined period of time, and
   display means connected to the output of said counter means for displaying refractivity in N-units when said center frequency of said sweep oscillator and said resonance frequency are equal.

2. An airborne microwave refractometer for determining the refractive index of air and providing an output of refractivity in N-units as set forth in claim 1 wherein said feedback circuit means includes means for differentiating said resonate signal and providing a narrow pulse in phase with the peak of the detected resonate voltage response of said sampling cavity.

3. An airborne microwave refractometer for determining the refractive index of air and providing an output of refractivity in N-units as set forth in claim 1 wherein said feedback circuit means includes a slew circuit for causing said sweep oscillator to search and lock onto said resonate signal output of said sampling cavity.

4. An airborne microwave refractometer for determining the refractive index of air and providing an output of refractivity in N-units as set forth in claim 1 wherein said counter means is a ten stage binary presettable counter and overflows a predetermined number of times during a predetermined period of gate time.

5. An airborne microwave refractometer for determining the refractive index of air and providing an output of refractivity in N-units as set forth in claim 1 having an inverting amplifier connected between said output of said counter means and said display means for providing an increasing output voltage for increasing N-units.

6. An airborne microwave refractometer for determining the refractive index of air and providing an output of refractivity in N-units as set forth in claim 1 wherein said sweep oscillator means includes a sweep oscillator and a frequency multiplier coupled between said sweep oscillator and said input of said open sampling cavity.

7. An airborne microwave refractometer for determining the refractive index of air and providing an output of refractivity in N-units as set forth in claim 6 wherein said display means includes a digital readout in real time.

8. An airborne microwave refractometer for determining the refractive index of air and providing an output of refractivity in N-units as set forth in claim 6 wherein said display means includes a chart printout.

9. An airborne microwave refractometer for determining the refractive index of air and providing an output of refractivity in N-units as set forth in claim 6 wherein said display means includes a magnetic tape recording.

* * * * *